(12) United States Patent
Zhang et al.

(10) Patent No.: US 9,893,173 B2
(45) Date of Patent: Feb. 13, 2018

(54) METHOD FOR FABRICATING A METALLIC OXIDE THIN FILM TRANSISTOR

(71) Applicant: SHENZHEN GRADUATE SCHOOL, PEKING UNIVERSITY, Shenzhen (CN)

(72) Inventors: Shengdong Zhang, Shenzhen (CN); Yang Shao, Shenzhen (CN); Xiang Xiao, Shenzhen (CN); Xin He, Shenzhen (CN)

(73) Assignee: SHENZHEN GRADUATE SCHOOL, PEKING UNIVERSITY, Shenzhen (CN)

(*) Notice: Subject to any disclaimer, the term of this patent is extended or adjusted under 35 U.S.C. 154(b) by 0 days.

(21) Appl. No.: 15/520,815

(22) PCT Filed: Oct. 31, 2014

(86) PCT No.: PCT/CN2014/000962
§ 371 (c)(1),
(2) Date: Apr. 20, 2017

(87) PCT Pub. No.: WO2016/061714
PCT Pub. Date: Apr. 28, 2016

(65) Prior Publication Data
US 2017/0317195 A1 Nov. 2, 2017

(30) Foreign Application Priority Data
Oct. 21, 2014 (CN) .......................... 2014 1 0562169

(51) Int. Cl.
*H01L 21/00* (2006.01)
*H01L 29/66* (2006.01)
(Continued)

(52) U.S. Cl.
CPC .... *H01L 29/66969* (2013.01); *H01L 21/0217* (2013.01); *H01L 21/02266* (2013.01);
(Continued)

(58) Field of Classification Search
CPC ......... H01L 29/66969; H01L 21/02565; H01L 21/02614; H01L 21/0217; H01L 21/02274; H01L 21/02266; H01L 29/7869
See application file for complete search history.

(56) References Cited

U.S. PATENT DOCUMENTS 7,605,026 B1 * 10/2009 Shieh .................. H01L 29/7869
257/346
9,318,614 B2 * 4/2016 Shieh .................. H01L 29/7869

FOREIGN PATENT DOCUMENTS

CN 102522429 A 6/2012
CN 103325840 A 9/2013
(Continued)

OTHER PUBLICATIONS

ISA State Intellectual Property Office of the People's Republic of China, International Search Report Issued in Application No. PCT/CN2014/000962, dated Jul. 22, 2015, WIPO, 4 pages.

*Primary Examiner* — Richard Booth
(74) *Attorney, Agent, or Firm* — McCoy Russell LLP (57) ABSTRACT

A method for fabricating a metal oxide thin film transistor comprises the steps of: selecting a substrate and fabricating a gate electrode on the substrate; growing a layer of dielectric or a high permittivity dielectric on the substrate, and allowing the layer of dielectric or high permittivity dielectric to cover the gate electrode to serve as a gate dielectric layer; growing a metal layer on the gate dielectric layer; fabricating a channel in the middle position of the metal layer; anodizing the metal of the channel at atmospheric pressure and room-temperature; fabricating an active region comprising a source, a drain, and the channel; depositing a silicon
(Continued)

nitride layer on the active region and forming two contact holes of the electrodes on the silicon nitride layer; and depositing a layer of aluminum film and fabricating two metal contact electrodes of the thin film transistor.

10 Claims, 6 Drawing Sheets

(51) Int. Cl.
    *H01L 21/02*     (2006.01)
    *H01L 29/786*     (2006.01)
(52) U.S. Cl.
    CPC .. *H01L 21/02274* (2013.01); *H01L 21/02565* (2013.01); *H01L 21/02614* (2013.01); *H01L 29/7869* (2013.01)

(56) References Cited

FOREIGN PATENT DOCUMENTS

| | | |
|---|---|---|
| CN | 104299915 A | 1/2015 |
| EP | 0588370 A2 | 3/1994 |
| JP | H08125193 A | 5/1996 |
| JP | 2000031494 A | 1/2000 |

\* cited by examiner

METHOD FOR FABRICATING A METALLIC OXIDE THIN FILM TRANSISTOR

CROSS-REFERENCE TO RELATED APPLICATIONS

The present application is a U.S. National Phase of International Patent Application Serial. No. PCT/CN2014/000962 entitled "METHOD FOR FABRICATING METALLIC OXIDE THIN FILM TRANSISTOR," filed on Oct. 31, 2014. International Patent Application Serial No. PCT/CN2014/000962 claims priority to Chinese Patent Application No. 201410562169.6, filed on Oct. 21, 2014. The entire contents of each of the above-referenced applications are hereby incorporated by reference for all purposes.

TECHNICAL FIELD

The present invention relates to a method for fabricating a transistor, particularly to a method for fabricating a metal oxide thin film transistor.

BACKGROUND

The thin film transistor has always been a switch control element of panel display or an integrated element of peripheral driving circuit. In addition, the thin film transistor is also widely studied and used in some fields such as sensor, storage, processor, etc. Currently, the thin film transistor which is widely used by the industry is mainly the traditional silicon-based thin film transistor, such as amorphous silicon thin film transistor and polycrystalline silicon thin film transistor. However, with the continuous development of the display technique, these silicon-based thin film transistors are beginning to fail to meet the higher and higher demand of people to flat panel display technique. In the amorphous silicon thin film transistor, the main disadvantages are low mobility, easily degraded performance, and the like, which greatly restrict its applications in the following aspects such as OLED pixel driver, the integration of LCD and OLED peripheral driving circuit, etc. Moreover, the high process temperature, high fabrication cost and poor uniformity make the polycrystalline silicon thin film transistor unsuitable for large size panel display application. Therefore, in order to develop the panel display technique, the metal oxide thin film transistor as a novel thin film transistor technique is recently widely studied.

The metal oxide thin film transistor has low process temperature, low process cost, high carrier mobility as well as uniform and stable device performance, which not only possesses the advantages of both amorphous silicon thin film transistor and polycrystalline silicon thin film transistor, but also possesses advantages such as high visible light transmittance, etc., and it is very promising for application in the next generation of large size, high resolution, and high frame frequency transparent display. The channel layer material used in the metal oxide thin film transistor mainly comprises zinc oxide (ZnO), indium oxide ($In_2O_3$), indium gallium zinc oxide (GIZO), zinc tin oxide (ZTO), indium zinc oxide (IZO), indium zinc tin oxide (TIZO), tin oxide ($SnO_2$), stannous oxide (SnO), cuprous oxide ($Cu_2O$), etc.

In the process for fabricating the metal oxide thin film transistor, in order to obtain proper threshold voltage, the channel layer needs a high resistance layer with a low carrier concentration, while in order to reduce parasitic resistance, the source and drain need a low resistance layer with a high carrier concentration. Unlike the polycrystalline silicon thin film transistor, the resistances of the source and drain of the metal oxide transistor cannot be reduced by the manner such as ion implantation, etc. Therefore, an additional metal layer with low resistance is needed for the source and drain, which increases the complexity of the fabrication process.

SUMMARY

With respect to the above problem, the purpose of the present invention is to provide a method for fabricating a metal oxide thin film transistor. This fabrication method enables the channel to be a high resistance metal oxide semiconductor, and the source and drain to be a low resistance metal, and the channel, the source and the drain are formed by one step deposition process, simplifying the fabricating process of the device, and saving production cost.

In order to achieve the above purpose, the invention employs the following technical solution: a method for fabricating a metal oxide thin film transistor, comprising the steps of: 1) selecting a substrate, growing a layer of metal film or transparent conductive film on the substrate, and then forming a gate electrode at the center position of the substrate by conducting photolithography and etching on this metal film or transparent conductive film; 2) growing a layer of dielectric or high permittivity dielectric on the substrate, and allowing the layer of dielectric or high permittivity dielectric to cover the gate electrode to serve as a gate dielectric layer; 3) growing a metal layer with a thickness of 10~100 nm on the gate dielectric layer, wherein this growing employs a DC magnetron sputtering method, metal or alloy targets are used, the purity is ≥99.99%, the sputtering pressure is between 0.3~2.5 Pa, and the gas is pure argon; 4) fabricating a channel in the middle position of the metal layer, then the metal of the channel is anodized at atmospheric pressure and room temperature, so as to form a metal oxide semiconductor layer, wherein this metal oxide semiconductor layer is the channel layer of the metal oxide thin film transistor; 5) fabricating a source and a drain, forming an active region comprising a source, a drain, and a channel, wherein the source and the drain are the metals in metal layer which are not treated by anodic oxidation treatment, and are located at the two ends of the channel and connected with the channel, both located on the gate dielectric layer; 6) depositing a silicon nitride layer on the active region by using a plasma enhanced chemical vapor deposition method or magnetron sputtering method, wherein this silicon nitride layer covers the gate dielectric layer, then conducting photolithography and etching on both the side of the source region and the side of the drain region on the silicon nitride layer to form two contact holes of the electrodes; 7) depositing a layer of aluminum film on the upper surface of the entire device by using the magnetron sputtering method, then fabricating two metal contact electrodes of the thin film transistor by using photolithography and etching, and leading each electrode of the thin film transistor out via the two contact electrodes, so as to complete the fabrication of the metal oxide thin film transistor.

In the step 4), the fabrication method of the channel is as follows: growing a layer of silicon nitride thin film with a thickness of 50 nm on the metal layer by using a plasma enhanced chemical vapor deposition method as dielectric protecting layer, and coating photoresist on the dielectric protecting layer, and conducting photolithography and etching on the dielectric protecting layer, wherein the part of the metal layer which is exposed to the outside is the channel.

In the step 4), the fabrication method of the channel is as follows: growing a layer of silicon nitride film with a thickness of 50 nm on the metal layer by using plasma enhanced chemical vapor deposition method as dielectric protecting layer, and coating photoresist on the dielectric protecting layer, then the photoresist is graphically exposed and developed, opening windows on the dielectric protecting layer, but not etching the dielectric protecting layer, the region of the metal layer to which this window region corresponds is the channel.

In the step 5), the fabrication method of the source and drain is: conducting photolithography and etching on the dielectric protecting layer and the metal layer thereunder to form the source and the drain.

In the step 4), the fabrication method of the channel is as follows: coating photoresist on the metal layer, then the photoresist is exposed and developed, to expose the channel on the metal layer, and protect other parts by the covering of the photoresist.

In the step 5), the fabrication method of the source and the drain is: conducting photolithography and etching on the metal layer to form the source and drain.

In the step 1), the substrate is a glass substrate with high temperature resistance or a flexible plastic substrate without high temperature resistance.

In the step 1), the metal film is formed by magnetron sputtering or thermal evaporation method, and the transparent conductive film is formed by magnetron sputtering method.

In the step 2), the method of growing a layer of dielectric on the substrate is as follows: growing a layer of dielectric on the substrate by using plasma enhanced chemical vapor deposition method; and the method of growing a layer of high permittivity dielectric on the substrate is as follows: growing a layer of high permittivity dielectric on the substrate by using magnetron sputtering or anodic oxidation method.

In the step 4), the method of anodic oxidation treatment of the metal of the channel is: employing a method of first constant current mode oxidation then constant voltage mode oxidation, that is, the current density being between 0.01~10 $mA/cm^2$ when in the constant current mode, turning into the constant voltage mode when the voltage increases to the predetermined value 1~300V, and keeping for several hours under the constant voltage mode, then the current reducing down to less than 0.01 $mA/cm^2$, and the anodic oxidation process is completed.

With the above technical solutions the present invention possesses the following advantages: 1 in the present invention with the anodic oxidation treatment of the metal layer, the metal layer is converted into a metal oxide semiconductor layer, and the metal oxide semiconductor layer is the channel layer of the device. Employing this treatment method, there is no need to additionally add a source and drain metal layer process, and the anodic oxidation treatment process only needs to be performed at atmospheric pressure and room temperature with cheap equipment, simple operation, and strong controllability. Therefore, the fabrication process of the transistor is simplified, and the production cost is reduced. 2. The fabrication method of the thin film transistor of the present invention is to form a channel through the anodic oxidation of the metal, this method enables the channel to be a high resistance metal oxide semiconductor, and the source and drain to be a low resistance metal, and the channel, the source, and the drain are formed by one step deposition process, simplifying the fabrication process of the device, and saving the production cost. The present invention can be widely used in the field of thin film transistor.

BRIEF DESCRIPTION OF THE FIGURES

FIG. 1.1 is a schematic diagram of fabricating the gate electrode on the substrate in example 1 of the present invention;

FIG. 1.2 is a schematic diagram of fabricating the gate dielectric layer in example 1 of the present invention;

FIG. 1.3 is a schematic diagram of fabricating the metal layer in example 1 of the present invention;

FIG. 1.4 is a schematic diagram of fabricating the dielectric protecting layer in example 1 of the present invention;

FIG. 1.5 is a schematic diagram of fabricating the channel in example 1 of the present invention;

FIG. 1.6 is a schematic diagram of fabricating the source and the drain in example 1 of the present invention;

FIG. 1.7 is a schematic diagram of fabricating the contact holes of the electrodes in example 1 of the present invention;

FIG. 1.8 is a cross-sectional schematic diagram of the fabricated metal oxide thin film transistor in example 1 of the present invention;

FIG. 2.1 is a schematic diagram of fabricating the gate electrode on the substrate in example 2 of the present invention;

FIG. 2.2 is a schematic diagram of fabricating the gate dielectric layer in example 2 of the present invention;

FIG. 2.3 is a schematic diagram of fabricating the metal layer in example 2 of the present invention;

FIG. 2.4 is a schematic diagram of fabricating the dielectric protecting layer in example 2 of the present invention;

FIG. 2.5 is a schematic diagram of fabricating the channel in example 2 of the present invention;

FIG. 2.6 is a schematic diagram of fabricating the source and the drain in example 2 of the present invention;

FIG. 2.7 is a schematic diagram of fabricating the contact holes of the electrodes in example 2 of the present invention;

FIG. 2.8 is a cross-sectional schematic diagram of the fabricated metal oxide thin film transistor in example 2 of the present invention;

FIG. 3.1 is a schematic diagram of fabricating the gate electrode on the substrate in example 3 of the present invention;

FIG. 3.2 is a schematic diagram of fabricating the gate dielectric layer in example 3 of the present invention;

FIG. 3.3 is a schematic diagram of fabricating the metal layer in example 3 of the present invention;

FIG. 3.4 is a schematic diagram of fabricating the channel in example 3 of the present invention;

FIG. 3.5 is a schematic diagram of fabricating the source and the drain in example 3 of the present invention;

FIG. 3.6 is a schematic diagram of fabricating the contact holes of the electrodes in example 3 of the present invention;

FIG. 3.7 is a cross-sectional schematic diagram of the fabricated metal oxide thin film transistor in example 3 of the present invention.

THE BEST EMBODIMENTS OF THE INVENTION

The present invention will be described in detail by combining with figures and examples below.

EXAMPLE 1

Figure 11:
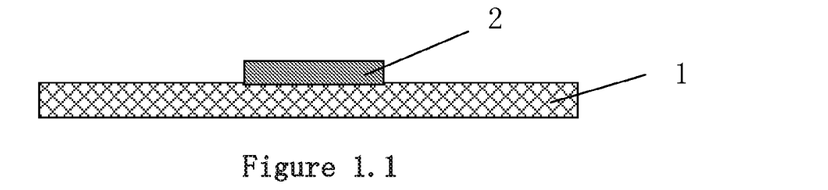

As shown in FIG. 1.1~FIG. 1.8, the present invention provides a method for fabricating a metal oxide thin film transistor, and this method forms a channel layer of metal oxide semiconductor by using anodic oxidation, thus fabricating a metal oxide thin film transistor, which specifically comprises the following steps:

1) as shown in FIG. 1.1, selecting a substrate 1, growing a layer of metal film such as chromium, molybdenum, titanium, hafnium, tantalum, or aluminum film, or transparent conductive film on the substrate 1, and then forming a gate electrode 2 at the center position of the substrate 1 by conducting photolithography and etching on this metal film or transparent conductive film, wherein, the thickness of the metal film or transparent conductive film is 100~300 nm; the metal film is formed by magnetron sputtering or thermal evaporation method, the transparent conductive film, such as indium tin oxide (ITO), etc., is formed by magnetron sputtering method.

Figure 12:
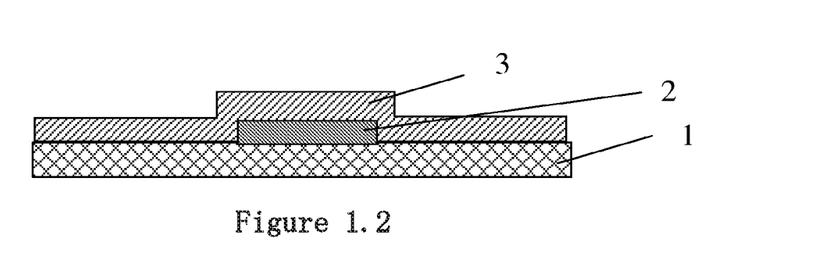

2) as shown in FIG. 1.2, growing a layer of dielectric or high permittivity (high-k) dielectric on the substrate 1, and allowing the layer of dielectric or high permittivity (high-k) dielectric to cover the gate electrode 2 to serve as a gate dielectric layer 3; wherein, the method of growing a layer of dielectric on the substrate 1 is as follows: growing a layer of dielectric with a thickness of 100~300 nm on the substrate 1 by using a plasma enhanced chemical vapor deposition (PECVD) method, and this dielectric is silicon nitride or silicon oxide, etc.

The method of growing a layer of high dielectric constant medium on the substrate 1 is as follows: growing a layer of high permittivity dielectric with a thickness of 100~300 nm on the substrate 1 by using magnetron sputtering or anodic oxidation method, this high permittivity dielectric is hafnium oxide, or tantalum oxide, or aluminum oxide, or a laminate formed of hafnium oxide, tantalum oxide, aluminum oxide, and other oxides, etc., that is, this high permittivity dielectric can be constituted of monolayer, bilayer, or multilayer material.

Figure 13:
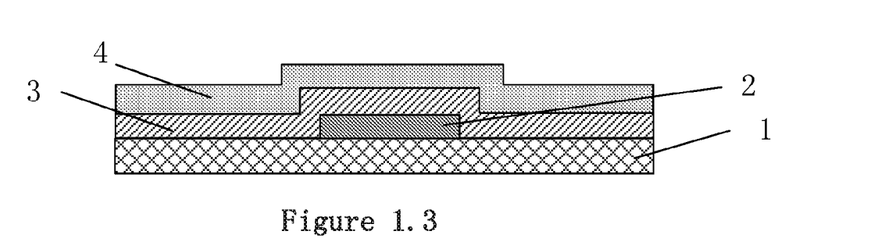

3) as shown in FIG. 1.3, growing a metal layer 4 with a thickness of 10~100 nm on the gate dielectric layer 3, this growing can employ a DC magnetron sputtering method, metal or alloy targets are used, the purity is ≥99.99%, the sputtering pressure is between 0.3~2.5 Pa, and the gas is pure argon; wherein, the metal layer 4 is metal material, which can be simple substance material or can be alloy material, the examples of the simple substance material are indium (In), zinc (Zn), tin (Sn), copper (Cu), nickel (Ni), titanium (Ti), molybdenum (Mo), tungsten (W), etc., and the examples of the alloy material are indium tin alloy, zinc titanium alloy, zinc tin alloy, indium zinc tin alloy, etc.

Figure 14:
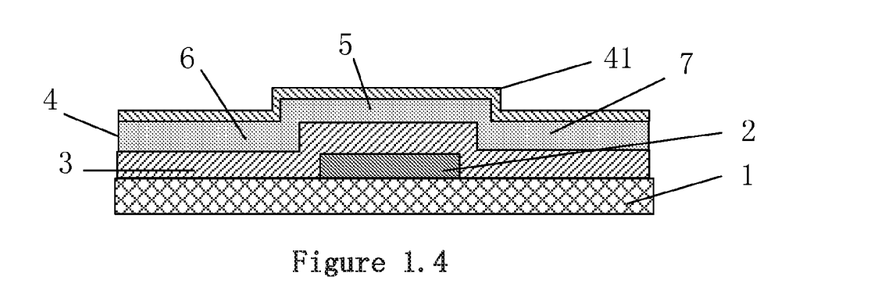
Figure 15:
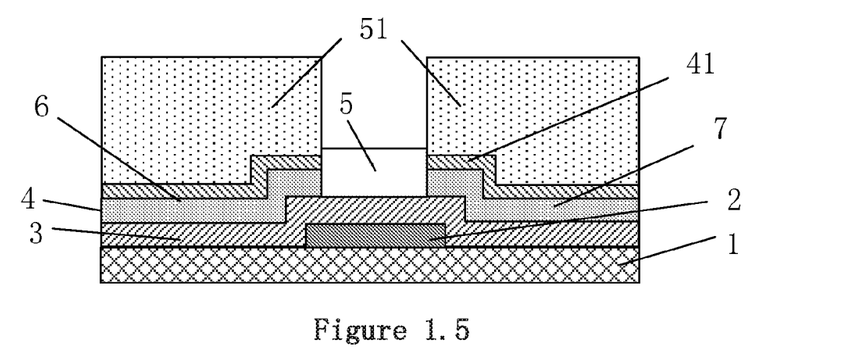

4) As shown in FIGS. 1.4 and 1.5, fabricating a channel 5 in the middle position of the metal layer 4, then the metal of the channel 5 is anodized at atmospheric pressure and room temperature, so as to form a metal oxide semiconductor layer, and this metal oxide semiconductor layer is the channel layer of the transistor of the present invention; wherein, the fabrication method of the channel 5 is as follows: growing a layer of silicon nitride thin film with a thickness of 50 nm on the metal layer 4 by using PECVD method as dielectric protecting layer 41, and coating photoresist 51 on the dielectric protecting layer 41, conducting photolithography and etching on the dielectric protecting layer 41, the part of the metal layer 4 exposed to the outside is the channel 5, and other parts are covered and protected by the dielectric protecting layer 41;

the method of anodic oxidation treatment of the metal of the channel 5 is: employing a method of first constant current mode oxidation then constant voltage mode oxidation, that is, the current density being between 0.01~10 mA/cm$^2$ when in constant current mode, turning into constant voltage mode when the voltage increases to the predetermined value 1~300V, and keeping for several hours under constant voltage mode, then the current reducing down to less than 0.01 mA/cm$^2$, and the anodic oxidation process is completed.

The metal oxide semiconductor layer can be indium oxide ($In_2O_3$), zinc oxide (ZnO), tin oxide ($SnO_2$), stannous oxide (SnO), cuprous oxide ($Cu_2O$), nickel oxide (NiO), titanium oxide ($TiO_2$), molybdenum oxide ($MoO_3$), or tungsten oxide ($WO_3$), also can be a combination of two or more of the above materials, for example, indium tin oxide ($InO_2$:Sn, abbreviated as ITO), indium zinc oxide (IZO), zinc tin oxide (TZO), or indium zinc tin (TIZO), etc.

Since the anodic oxidation treatment employed in the present invention is performed under atmospheric pressure and room temperature, it is a low temperature process with simple operation and low cost, which is suitable for mass production. Moreover, the variable involved in the anodic oxidation process is mainly oxidation voltage and oxidation current, thus improving the controllability and repeatability of the fabrication.

Figure 16:
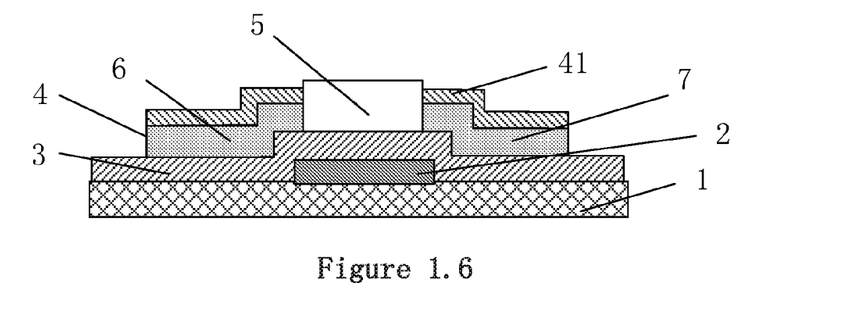

5) As shown in FIG. 1.6, fabricating a source 6 and a drain 7, forming an active region comprising a source 6, a drain 7, and a channel 5, the source 6 and the drain 7 are metals in metal layer 4 which are not treated via anodic oxidation, and are located at the two ends of the channel 5 and connected with the channel 5, both located on the gate dielectric layer 3; wherein the fabrication method of the source 6 and the drain 7 is: conducting photolithography and etching on the dielectric protecting layer 41 and the metal layer 4 thereunder to form the source 6 and drain 7.

Figure 17:
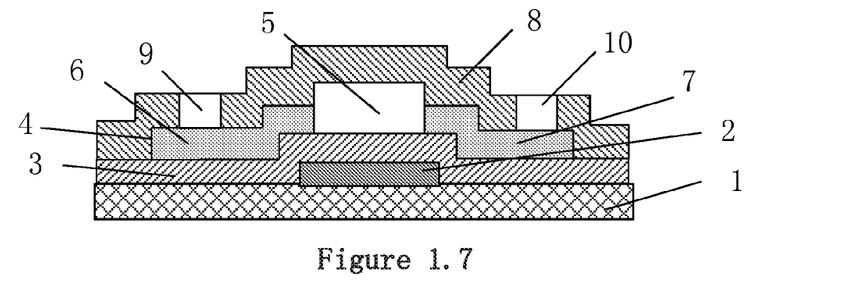

6) As shown in FIG. 1.7, depositing a silicon nitride layer 8 on the active region by using PECVD method or magnetron sputtering method, this silicon nitride layer 8 covers the gate dielectric layer 3, then conducting photolithography and etching on both the side of the source region 6 and the side of the drain region 7 on the silicon nitride layer 8 to form two contact holes 9, 10 of the electrodes; wherein, the thickness of the silicon nitride layer 8 is 10~300 nm.

Figure 18:
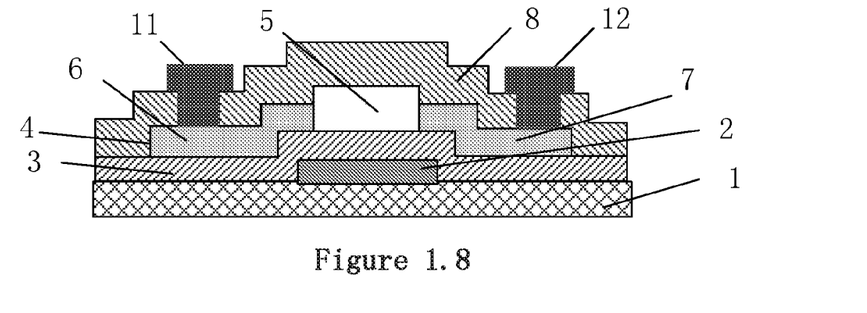

7) As shown in FIG. 1.8, depositing a layer of aluminum film on the upper surface of the entire device by using the magnetron sputtering method, then fabricating two metal contact electrodes 11, 12 of the thin film transistor by using photolithography and etching, leading each electrode of the thin film transistor out via the contact electrodes 11, 12, so as to complete the fabrication of the metal oxide thin film transistor; wherein, the thickness of the aluminum film is 10~300 nm.

In the above step 1), the substrate 1 can employ a substrate with high temperature resistance or a flexible substrate without high temperature resistance, the example of the substrate with high temperature resistance is glass substrate, and the example of the flexible substrate without high temperature resistance is plastic substrate.

EXAMPLE 2

Figure 21:
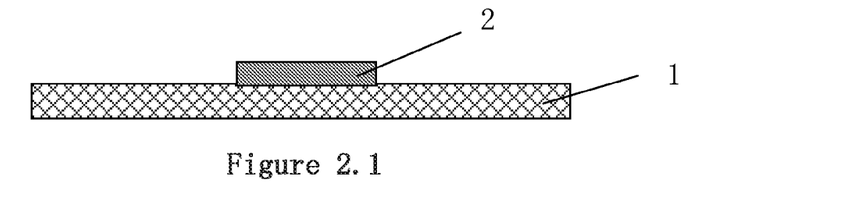

As shown in FIGS. 2.1~2.8, the method for fabricating the metal oxide thin film transistor disclosed in this example is similar as that disclosed in example 1, the differences are as follows:

In step 1), as shown in FIG. 2.1, the thickness of the metal film or transparent conductive film employed in this example is 10~300 nm.

Figure 22:
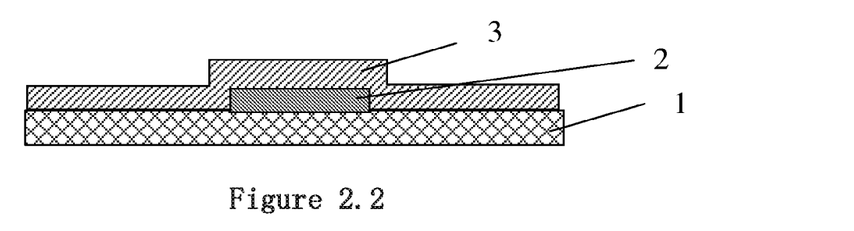
Figure 23:
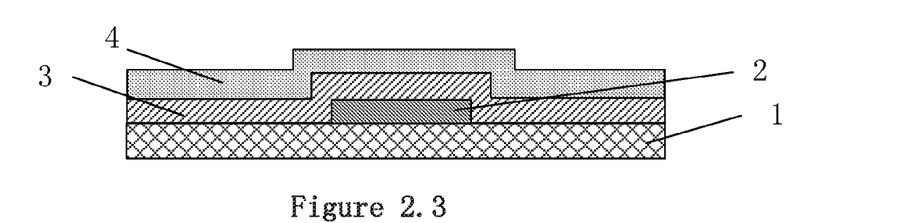

In step 2), as shown in FIG. 2.2, the method of growing a layer of dielectric on the substrate 1 employed in this example is: growing a layer of dielectric with a thickness of 10~300 nm on the substrate 1 by using a plasma enhanced chemical vapor deposition (PECVD) method, and this dielectric is silicon nitride or silicon oxide, etc.

Figure 24:
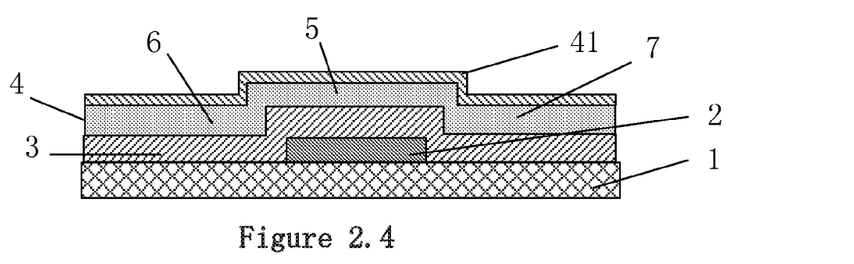
Figure 25:
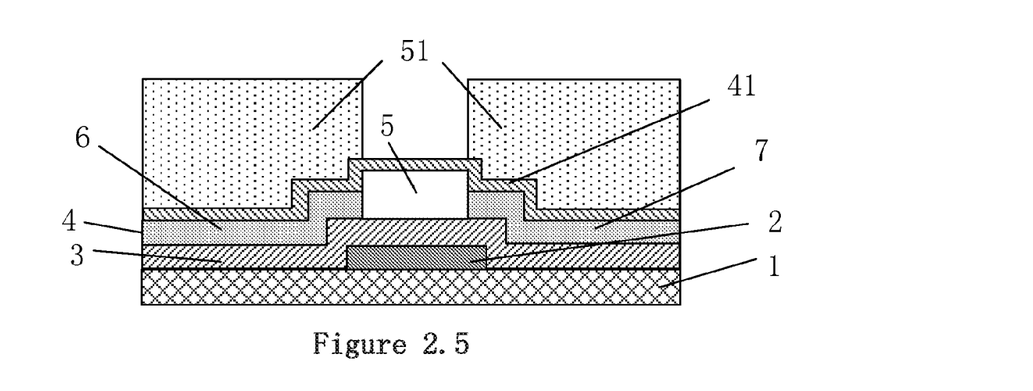
Figure 26:
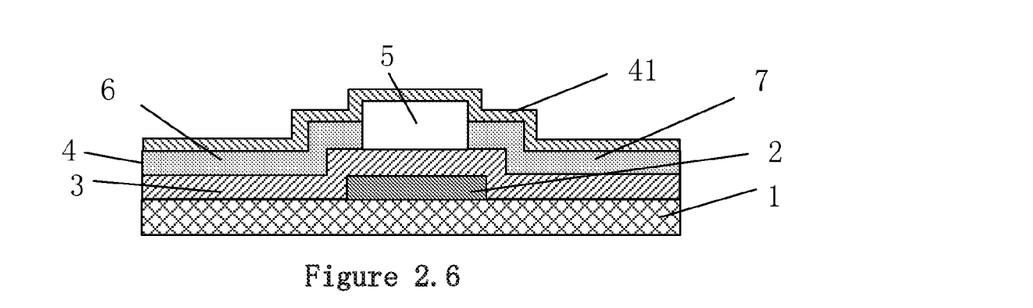

In step 4), as shown in FIGS. 2.4 and 2.5, the fabrication method of the channel 5 is as follows: growing a layer of silicon nitride thin film with a thickness of 50 nm on the metal layer 4 by using a PECVD method as a dielectric protecting layer 41, and coating photoresist 51 on the dielectric protecting layer 41, then the photoresist 51 is graphically exposed and developed, opening windows on the dielectric protecting layer 41, but not etching the dielectric protecting layer 41, the region of the metal layer 4 to which this window region corresponds is the channel 5: the region on the metal layer 4 is needed to be anodized such that the metal is oxidized to an oxide, so as to form the channel 5.

Figure 27:
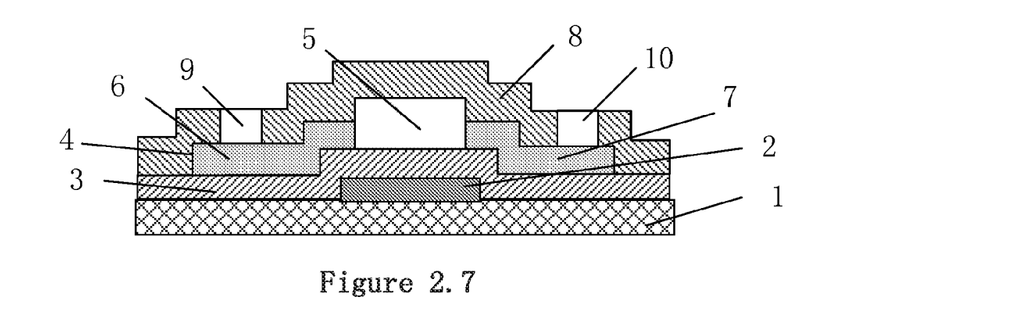

In step 6), as shown in FIG. 2.7, the thickness of the silicon nitride layer 8 is 100~300 nm.

Figure 28:
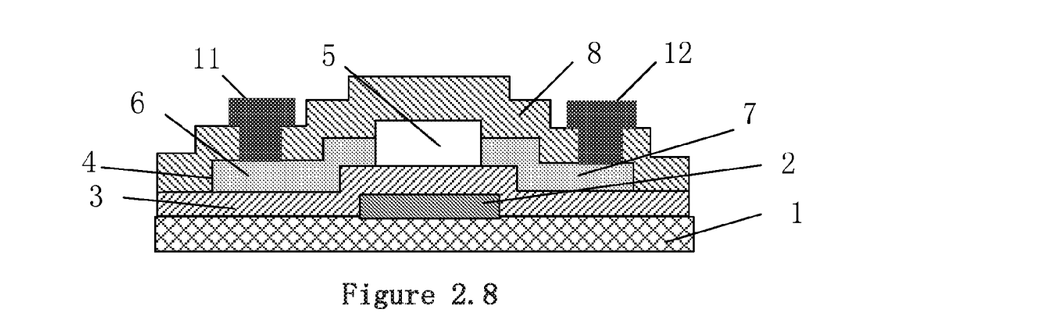

In step 7), as shown in FIG. 2.8, the thickness of the aluminum film is 100~300 nm.

EXAMPLE 3

Figure 31:
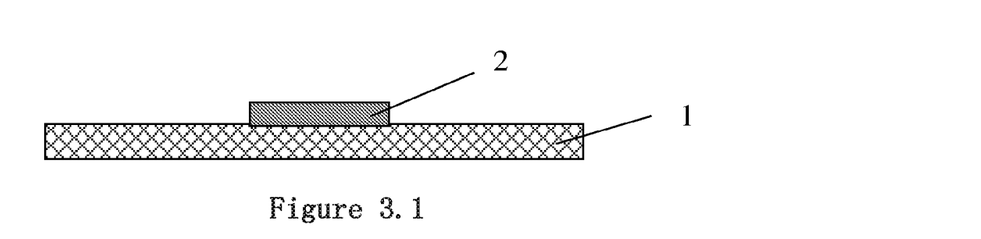

As shown in FIGS. 3.1~3.7, the method for fabricating the metal oxide thin film transistor disclosed in this example is similar as that disclosed in example 1, the differences are as follows:

In step 1), as shown in FIG. 3.1, the thickness of the metal film or transparent conductive film employed in this example is 10~300 nm.

Figure 32:
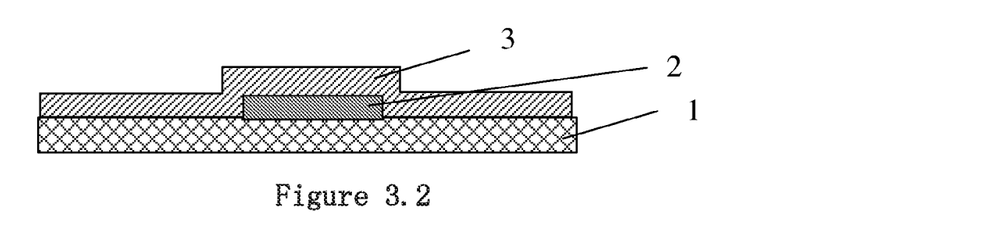
Figure 33:
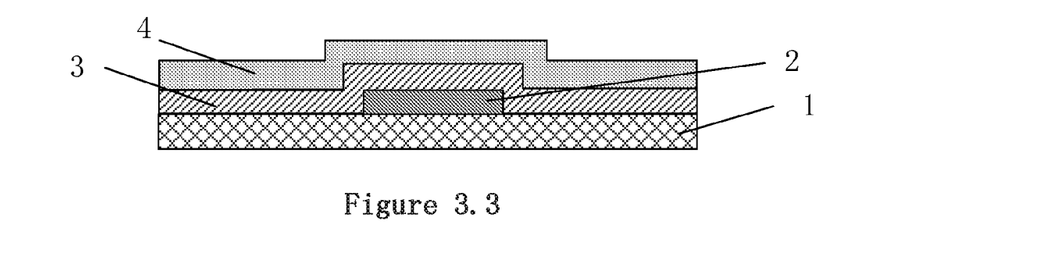

In step 2), as shown in FIG. 3.2, the method of growing a layer of dielectric on the substrate 1 employed in this example is: growing a layer of dielectric with a thickness of 10~300 nm on the substrate 1 by using a plasma enhanced chemical vapor deposition method, and this dielectric is silicon nitride or silicon oxide, etc.

The method of growing a layer of high permittivity dielectric on the substrate 1 is as follows: growing a layer of high permittivity dielectric with a thickness of 100~300 nm on the substrate 1 by using magnetron sputtering or anodic oxidation method, and this high permittivity dielectric is hafnium oxide, or tantalum oxide, or aluminum oxide, or a laminate formed of hafnium oxide, tantalum oxide, aluminum oxide, and other oxides, etc.

Figure 34:
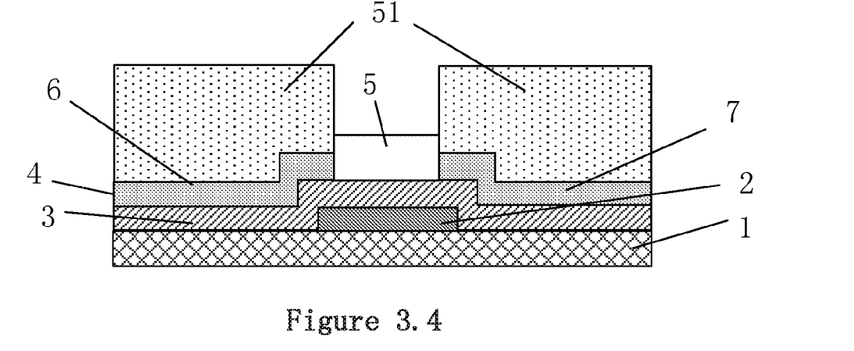
Figure 35:
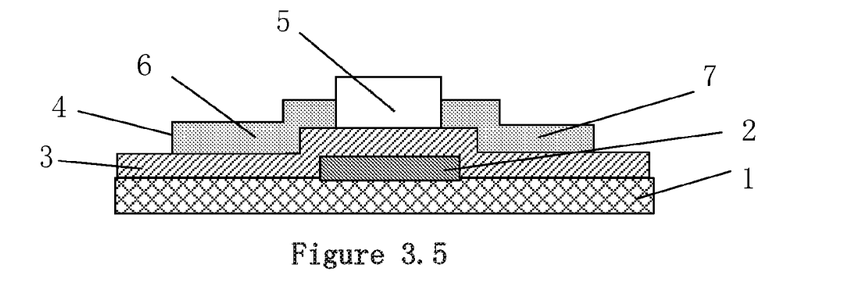
Figure 36:
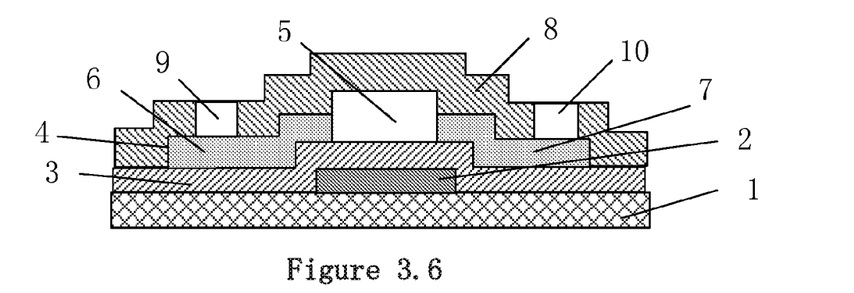
Figure 37:
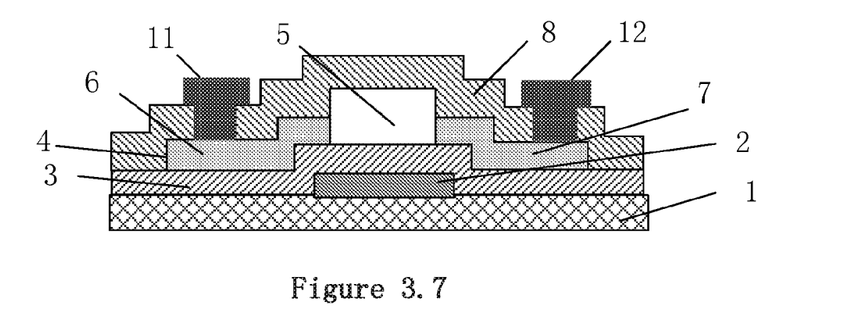

In step 4), as shown in FIGS. 3.4 and 3.5, the fabrication method of the channel 5 is as follows: coating photoresist 51 on the metal layer 4, then the photoresist 51 is exposed and developed, exposing the channel 5 of the metal layer 4, and covering and protecting other parts by the photoresist. The method of an anodic oxidation treatment of the metal of the channel 5 is: employing a method of first constant current mode oxidation then constant voltage mode oxidation, that is, the current density is between 0.01~10 mA/cm$^2$ when in constant current mode, turning into constant voltage mode when the voltage increases to the predetermined value of 1~300V, and keeping for several hours under constant voltage mode, then the current reduces down to less than 0.01 mA/cm$^2$, and the anodic oxidation process is completed.

In step 5), as shown in FIG. 3.5, the fabrication method of the source 6 and the drain 7 is: conducting photolithography and etching on the metal layer 4 to form the source 6 and the drain 7.

In each of the above examples, the present invention allows the channel 5 to be a high resistance metal oxide semiconductor with a low carrier concentration by an anodic oxidation treatment of the channel 5. The source 6 and the drain 7 of the thin film transistor are formed with the metal films which is not treated via an anodic oxidation, there is no need to add a process step of additionally adding a source and drain metal layer, thus the fabrication process of the transistor is simplified.

Each of the above examples is only used to illustrate the present invention, the connection and structure of each component both can be altered, based on the technical solutions of the present invention, all the modifications and equivalent transformations to the connection and structure of individual component according to the principles of the present invention should not be excluded by the protection scope of the present invention.

The invention claimed is:

1. A method for fabricating metal oxide thin film transistors, comprising the steps of:
    1) selecting a substrate, growing a layer of metal film or transparent conductive film on the substrate, and then forming a gate electrode at the center position of the substrate by conducting photolithography and etching on the metal film or transparent conductive film;
    2) growing a layer of dielectric or high permittivity dielectric on the substrate, and allowing the layer of dielectric or a high permittivity dielectric to cover the gate electrode to serve as a gate dielectric layer;
    3) growing a metal film with a thickness of 10~100 nm on the gate dielectric layer, wherein the growing employs a DC magnetron sputtering method, metal or alloy targets are used, the purity is >99.99%, the sputtering pressure is between 0.3~2.5 Pa, and the gas is pure argon;
    4) fabricating a channel in the middle position of the metal layer by an anodic oxidation treatment of the metal of the channel at atmospheric pressure and room temperature, so as to form a metal oxide semiconductor layer, wherein the metal oxide semiconductor layer is the channel layer of the metal oxide thin film transistor;
    5) fabricating a source and a drain , so as to form an active region comprising a source a drain, and a channel, wherein the source and the drain are metals in the metal layer which are not treated by anodic oxidation, and are located at the two ends of the channel and connected with the channel, both located on the gate dielectric layer;
    6) depositing a silicon nitride layer on the active region by using a plasma enhanced chemical vapor deposition method or magnetron sputtering method, wherein the silicon nitride layer covers the gate dielectric layer, then conducting photolithography and etching on the side of the source region and the side of the drain region on the silicon nitride layer to form two contact holes of the electrodes;
    7) depositing a layer of aluminum film on the upper surface of the entire device by using the magnetron sputtering method, then fabricating two metal contact electrodes of the thin film transistor by using photolithography and etching, and leading each electrode of the thin film transistor out via the two contact electrodes, so as to complete the fabrication of the metal oxide thin film transistor.

2. The method for fabricating the metal oxide thin film transistor according to claim 1, wherein: in the step 4), the fabrication method of the channel is as follows: growing a layer of silicon nitride film with a thickness of 50 nm on the metal layer by using a plasma enhanced chemical vapor deposition method as a dielectric protecting layer, and coating photoresist on the dielectric protecting layer, conducting photolithography and etching on the dielectric protecting layer, wherein the part of the metal layer exposed to the outside is the channel.

3. The method for fabricating the metal oxide thin film transistor according to claim 1, wherein: in the step 4), the fabrication method of the channel is as follows: growing a layer of silicon nitride thin film with a thickness of 50 nm on the metal layer by using a plasma enhanced chemical vapor deposition method as a dielectric protecting layer, and coating photoresist on the dielectric protecting layer, then the photoresist is graphically exposed and developed, opening windows on the dielectric protecting layer, but not etching the dielectric protecting layer, wherein the region of the metal layer to which the window region corresponds is the channel.

4. The method for fabricating the metal oxide thin film transistor according to claim 2, wherein: in the step 5), the fabrication method of the source and the drain is: conducting photolithography and etching on the dielectric protecting layer and the metal layer thereunder to form the source and the drain.

5. The method for fabricating the metal oxide thin film transistor according to claim 1, wherein: in the step 4), the fabrication method of the channel is as follows: coating photoresist on the metal layer, then the photoresist is exposed and developed to expose the channel of the metal layer, and protect other parts by the covering of the photoresist.

6. The method for fabricating the metal oxide thin film transistor according to claim 1, wherein: in the step 5), the fabrication method of the source and the drain is: conducting photolithography and etching on the metal layer to form the source and the drain.

7. The method for fabricating the metal oxide thin film transistor according to claim 1, wherein: in the step 1), the substrate is a glass substrate with high-temperature resistance or a flexible plastic substrate without high-temperature resistance.

8. The method for fabricating the metal oxide thin film transistor according to claim 1, wherein: in the step 1), the metal film is formed by a magnetron sputtering or thermal evaporation method, and the transparent conductive thin film is formed by a magnetron sputtering method.

9. The method for fabricating the metal oxide thin film transistor according to claim 1, wherein: in the step 2), the method of growing a layer of dielectric on the substrate is as follows: growing a layer of dielectric on the substrate by using a plasma enhanced chemical vapor deposition method; and the method of growing a layer of high permittivity dielectric on the substrate is as follows: growing a layer of high permittivity dielectric on the substrate by using a magnetron sputtering or anodic oxidation method.

10. The method for fabricating the metal oxide thin film transistor according to claim 1, wherein: in the step 4), the method of anodic oxidation treatment of the metal of the channel is: employing a method of first constant current mode oxidation then constant voltage mode oxidation, that is, the current density being between 0.01~10 mA/cm$^2$ when in constant current mode, turning into constant voltage mode when the voltage increases to the predetermined value 1~300V, keeping for several hours under constant voltage mode, then the current reducing down to less than 0.01 mA/cm$^2$, and the anodic oxidation process is completed.

* * * * *